US 6,696,707 B2

(12) United States Patent
Polce et al.

(10) Patent No.: US 6,696,707 B2
(45) Date of Patent: *Feb. 24, 2004

(54) HIGH VOLTAGE INTEGRATED SWITCHING DEVICES ON A BONDED AND TRENCHED SILICON SUBSTRATE

(75) Inventors: Nestore A. Polce, Chelmsford, MA (US); Scotten W. Jones, Georgetown, MA (US); Mark F. Heisig, Newburyport, MA (US)

(73) Assignee: CCP. Clare Corporation, Beverly, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/298,426

(22) Filed: Apr. 23, 1999

(65) Prior Publication Data
US 2002/0056851 A1 May 16, 2002

(51) Int. Cl.[7] ............................................... H01L 29/66
(52) U.S. Cl. ..................... 257/168; 257/328; 257/339
(58) Field of Search ............................. 257/168, 328, 257/338, 337, 339, 335, 350, 357, 356, 378, 409, 343

(56) References Cited

U.S. PATENT DOCUMENTS

| 4,139,442 A | 2/1979 | Bondur et al. | 204/192 E |
|---|---|---|---|
| 4,467,344 A | 8/1984 | Chang et al. | 357/39 |
| 4,587,545 A | 5/1986 | Berthold et al. | 357/38 |
| 4,602,268 A | 7/1986 | Hartman et al. | 357/38 |
| 4,608,590 A | 8/1986 | Hartman et al. | 357/38 |
| 4,754,310 A | 6/1988 | Coe | 357/13 |
| 4,916,085 A | * 4/1990 | Frisina | 437/44 |
| 5,057,895 A | 10/1991 | Beasom | 357/49 |
| 5,171,699 A | * 12/1992 | Hutter et al. | 437/41 |
| 5,181,095 A | * 1/1993 | Mosher et al. | 257/370 |
| 5,216,275 A | 6/1993 | Chen | 257/493 |
| 5,336,634 A | 8/1994 | Katayama et al. | 437/63 |
| 5,466,963 A | 11/1995 | Beasom | 257/516 |
| 5,467,347 A | 11/1995 | Petersen | 370/60.1 |
| 5,479,498 A | 12/1995 | Brandman et al. | 379/283 |
| 5,512,774 A | 4/1996 | Nakagawa et al. | 257/501 |
| 5,554,872 A | * 9/1996 | Baba et al. | 257/342 |
| 5,683,075 A | 11/1997 | Gaul et al. | 257/510 |
| 5,688,702 A | * 11/1997 | Nakagawa et al. | 437/33 |
| 5,841,197 A | * 11/1998 | Adamic, Jr. | 257/777 |
| 5,856,700 A | 1/1999 | Woodbury | 257/518 |
| 5,872,044 A | 2/1999 | Hemmenway et al. | 438/426 |
| 5,914,280 A | 6/1999 | Gelzinis | 438/734 |
| 5,939,755 A | * 8/1999 | Takeuchi et al. | 257/347 |

* cited by examiner

Primary Examiner—Tom Thomas
Assistant Examiner—Douglas W. Owens
(74) Attorney, Agent, or Firm—McDermott Will & Emery

(57) ABSTRACT

A high voltage integrated switching device includes at least one high voltage switching circuit, preferably employing DMOS technology and characterized by a breakdown voltage of at least 100 volts, on a dielectrically isolated, bonded and vertically trenched silicon substrate. Multiple high-voltage switching circuits may be located in close proximity on a single substrate without circuit breakdown or shorting during circuit operation. The circuit may further include one or more low- and/or intermediate-voltage circuits employing, for example, CMOS and bipolar technologies on the same silicon substrate and located in close proximity without voltage breakdown during circuit operation.

5 Claims, 9 Drawing Sheets

HIGH VOLTAGE INTEGRATED SWITCHING DEVICES ON A BONDED AND TRENCHED SILICON SUBSTRATE

TECHNICAL FIELD

The present invention relates to high voltage integrated switching devices and to methods of fabricating several of such devices on a single silicon substrate.

BACKGROUND OF THE INVENTION

The term "breakdown voltage", as used herein, means the voltage required to cause current to leak through a dielectric insulator, thereby causing a short circuit between inadequately dielectrically isolated devices or components. The term "high voltage", as used herein, means a device which has a breakdown voltage of at least 100 volts, and possibly much greater. The term "intermediate voltage", as used herein means a device which has a breakdown voltage from approximately 20 volts up to approximately 100 volts. The term "low voltage", as used herein means a device which has a breakdown voltage less than and up to approximately 20 volts.

High-voltage switching applications in, for example, telephone central office switching stations generally require a large number of high-voltage switching circuits on a single circuit board. The density and proximity of several high-voltage circuits on a single board requires adequate dielectric isolation between them to avoid shorting of the individual circuits.

High voltage circuits are preferably dielectrically isolated in both the vertical and lateral directions. Vertical isolation techniques are well known in the semiconductor manufacturing industry, and adequate vertical isolation is not difficult to achieve. However, adequate lateral isolation in a relatively confined space has been much more difficult to achieve.

In the past, such dielectric isolation has generally been provided by locating the individual switching circuits a substantial lateral distance apart from one another and by filling the inter-circuit spaces with a dielectric insulating material.

The higher the voltage rating of a device, the greater the dielectric isolation required between adjacent devices. To prevent premature breakdown of adjacent devices due to the magnitude of the electric fields from each of the devices, a dielectric filler material is preferably used to fill the spaces between the devices. The breakdown voltage of a device is a function of the amount of dielectric material between adjacent high voltage devices. Using this isolation approach, optimal spacing of high voltage devices therefore may require relatively great amounts of dielectric isolation material between and around them, and this in turn requires that the devices be more widely spaced apart over a larger area.

The use of bonded and vertically trenched silicon substrates in the fabrication of multiple high voltage devices allows adjacent devices to be spaced as closely as 3 micrometers from one another in the lateral direction. Vertical trenching processes are well known and disclosed in, for example, U.S. Pat. No. 4,139,442 to Bondur et al. With anisotropic etching, the extent of material removal in the lateral direction can be more closely controlled and is generally less than the extent of material removal in the vertical direction. This is highly advantageous in controlling manufacturing costs and increasing throughput in the fabrication of low voltage devices. However, such substrates have heretofore not been used in the fabrication of multiple high voltage devices.

It would therefore be advantageous to provide a high voltage integrated switching device which includes, for example, multiple high-voltage circuits or a variety of high-, medium- and low-voltage circuits, on a single bonded and vertically trenched silicon substrate.

SUMMARY OF THE INVENTION

According to one aspect of the invention, there is provided a high voltage integrated switching device, comprising a dielectrically isolated, bonded and vertically trenched silicon substrate, and at least one high voltage switching circuit fabricated on the substrate. The high voltage switching circuit is characterized by a breakdown voltage of at least 100 volts or greater.

In a preferred embodiment, the high voltage switching circuit is a bidirectional switching circuit that is characterized by a breakdown voltage of at least 350 volts.

The high voltage switching circuit preferably employs double diffused metal oxide semiconductor (DMOS) technology.

The device can include one or more intermediate and/or low voltage circuits on the same substrate. In one embodiment the intermediate voltage circuit preferably employs bipolar technology, and the low voltage circuit preferably employs complementary metal oxide semiconductor (CMOS) technology.

According to another aspect of the invention, there is provided a method of making a high voltage integrated switching device. The method comprises the steps of:

providing a bonded pair of silicon wafers separated by a layer of insulating silicon dioxide;

forming a network of substantially vertical trenches in one wafer of the bonded pair to define a plurality of silicon active regions, and dielectrically isolating the silicon active regions from one another;

doping the silicon active regions with a dopant material of the same conductivity type to form tubs, each including a silicon wraparound layer having a relatively high concentration of that conductivity type on the floors and sidewalls of the tubs; and fabricating at least one high voltage switching circuit in at least one of the silicon active regions.

In one preferred embodiment, the step of fabricating the at least one high voltage switching circuit comprises the following steps:

forming a layer of highly pure silicon dioxide over a silicon active region;

forming a layer of polycrystalline silicon over the silicon dioxide layer; exposing selected portions of the silicon dioxide and polycrystalline silicon layers;

forming at least one p-type region within the exposed portions by implanting a p-type dopant therein;

forming at least one n-type region within each of the p-type regions to define source contacts for the high voltage circuit, and forming an n-type region bridging the silicon active region and the wraparound region, by implanting an n-type dopant therein, to define a drain contact for the high voltage circuit; and forming electrically conductive contact pads over each of the source and drain contacts of the high voltage circuit.

In one preferred embodiment, the p-type dopant includes an element selected from the group consisting of arsenic and phosphorus. The p-type dopant preferably, although not necessarily, includes boron.

The method can further include the steps of fabricating at least one of an intermediate voltage and/or a low voltage circuit in respective silicon active regions during fabrication of the high voltage switching circuit, and on the same substrate.

In one preferred embodiment, the step of fabricating the intermediate voltage circuit comprises the steps of:

forming at least one p-type region within the silicon active region by implanting a p-type dopant therein;

forming an n-type region within the p-type region to define an emitter, and forming an n-type region within the silicon active region outside of the p-type region to define a collector, the n-type region extending from the silicon active region to the n+ wraparound region;

forming a p+ region within the p-type region to define a base; and forming electrically conductive contact pads over the collector, emitter and base of the bipolar circuit.

In one preferred embodiment, the step of fabricating the low voltage circuit preferably comprises the steps of:

defining an n-channel and a p-channel in respective adjacent silicon active regions;

forming at least one p-type region within the silicon active region of the n-channel by implanting a p-type dopant therein;

forming a layer of highly pure silicon dioxide on the surfaces of the p-type region and the silicon active regions of the n-channel and p-channel;

forming a layer of polycrystalline silicon over the silicon dioxide layer; forming at least one source contact and at least one drain contact in the p-channel by implanting a p-type dopant into selected portions of the p-channel;

forming at least one source contact and at least one drain contact in the n-channel by implanting an n-type dopant into selected portions of the n-channel;

forming an n-type region within each of the p-channel and the n-channel, the n-type region extending from a p-type region to the n+ wraparound region in each channel; and forming electrically conductive contact pads over the source and drain contacts of the p-channel and n-channel.

According to yet another aspect of the invention, there is provided a high voltage integrated switching device which comprises:

a dielectrically isolated, bonded and vertically trenched silicon substrate; at least one high voltage switching circuit fabricated on the substrate; at least one intermediate voltage circuit fabricated on the substrate; and at least one low voltage circuit fabricated on the substrate. The high voltage switching circuit preferably has a breakdown voltage of at least 100 volts. The intermediate voltage circuit preferably has a breakdown voltage of up to about 100 volts, and the low voltage circuit preferably has a breakdown voltage of up to about 20 volts.

In a preferred embodiment, the high voltage switching circuit comprises a bidirectional switching circuit and is characterized by a breakdown voltage of at least 350 volts or more.

In a preferred embodiment, the high voltage switching circuit employs DMOS technology, the intermediate voltage circuit employs bipolar technology, and the low voltage circuit employs CMOS technology.

These and other objects and advantages of the invention will in part be obvious and will in part appear hereinafter. The invention accordingly comprises the apparatus possessing the construction, combination of elements and arrangement of parts which are exemplified in the following detailed disclosure, the scope of which will be indicated in the claims.

BRIEF DESCRIPTION OF THE DRAWINGS

For a fuller understanding of the nature and objects of the present invention, reference should be made to the following detailed description taken in connection with the accompanying drawings, in which.

DETAILED DESCRIPTION OF THE DRAWINGS

The present invention allows multiple high-voltage integrated circuits having a breakdown voltage of at least 100 volts, and in particular devices having a breakdown voltage of at least 350 volts or greater, to be fabricated in relatively close proximity on a single silicon substrate, without shorting of the circuits or breakdown of the dielectric material between the circuits and circuit components during operation. Sufficient lateral dielectric isolation between the individual integrated circuits is provided by using bonded and vertically trenched and dielectric-filled silicon wafers.

One or more low and/or intermediate voltage integrated circuits may also be fabricated with the high voltage circuits on the same substrate using, for example, CMOS and bipolar technologies.

Figure 1A:
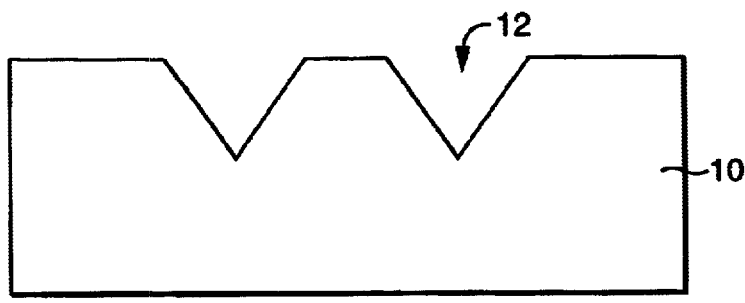
FIG. 1A is a simplified view of an etched silicon wafer in preparation for use as a traditional DI silicon substrate, as known in the prior art.
Figure 1B:
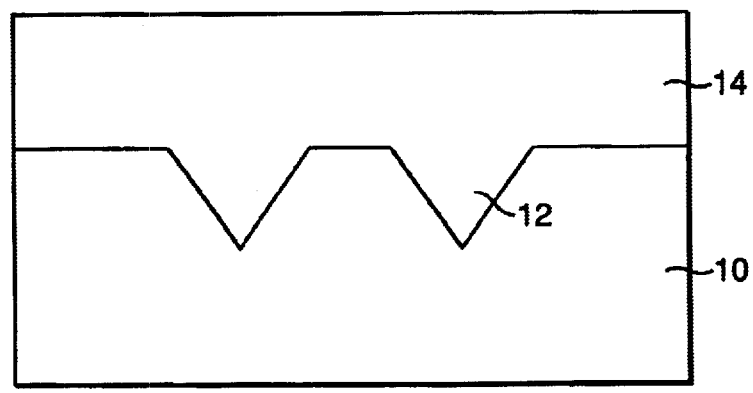
FIG. 1B is a simplified view of the etched silicon wafer of FIG. 1A, on which a polycrystalline layer is grown over the etched surface, as known in the prior art.
Figure 1C:
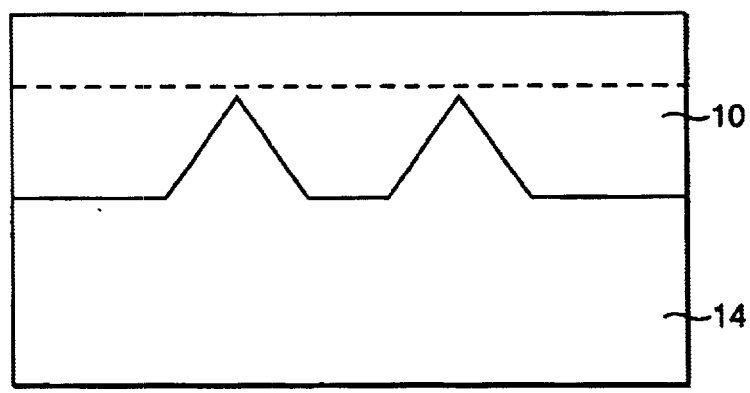
FIG. 1C is a simplified view of the silicon substrate of FIG. 1B, now inverted so that the polycrystalline silicon layer is on the bottom and the back side of the silicon wafer is exposed.
Figure 1D:
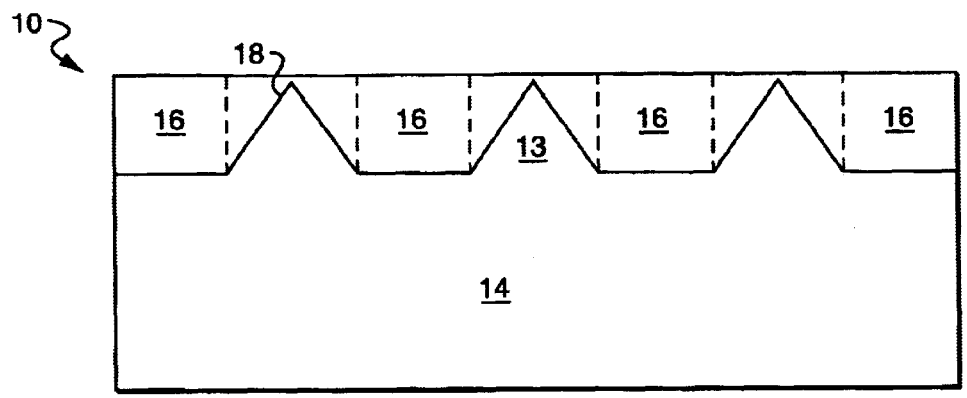
FIG. 1D is a simplified view of the silicon substrate of FIG. 1C, in which the exposed silicon has been polished to define individual active regions of silicon separated by polycrystalline silicon regions, as known in the art.

Traditional dielectric isolation is achieved in the prior art by etching a silicon wafer 10 with an acid or suitable etchant on one side of the wafer according to a predetermined pattern to form several depressions or valleys 12 in the wafer, as shown in FIG. 1A. The valleys have sloped sides due to the wet-etch characteristics of common etchants, which etch the silicon along crystal planes. The etched regions of the silicon are then doped with a high concentration of silicon of the complementary conductivity type, i.e., n+ in n-type silicon, or p+ in p-type silicon, to form an n+ or p+ wraparound region. The etched region is then lined with a dielectric material such as, for example, silicon dioxide. A polycrystalline silicon layer 14 is then grown over the etched side of the wafer 10 to provide a convenient means of handling the wafer, as shown in FIG. 1B. The back side of the wafer 10 is then polished to the level of the polycrystalline silicon layer 14, as shown in FIG. 1C, to produce individual silicon active regions 16 having sloped sidewalls 18, as shown in FIG. 1D. Each active region 16 is separated from its adjacent neighbor by a triangular region 13 of insulating polycrystalline silicon which is thickest at its base and thinnest at the surfaces of the active regions.

As evident from FIG. 1D, traditional DI substrates are relatively space-inefficient, due to the sloped sides characteristic of common wet-etching processes. In addition, if high voltage devices are to be fabricated in the active regions 16, they must be adequately laterally spaced and filled with sufficient dielectric material to avoid shorting and breakdown during operation. This may require that each active region 16 created in the fabrication of the high voltage device be limited to a region between the dotted lines provided by the triangular region in FIG. 1D, to add additional insulation in the regions 16A between the active regions, as the space provided by the triangular region 13 may not be sufficiently dielectrically insulating for the particular devices being fabricated on opposite sides thereof. This causes the high voltage devices to be relatively far apart on the substrate and necessitates a larger substrate.

Figure 1E:
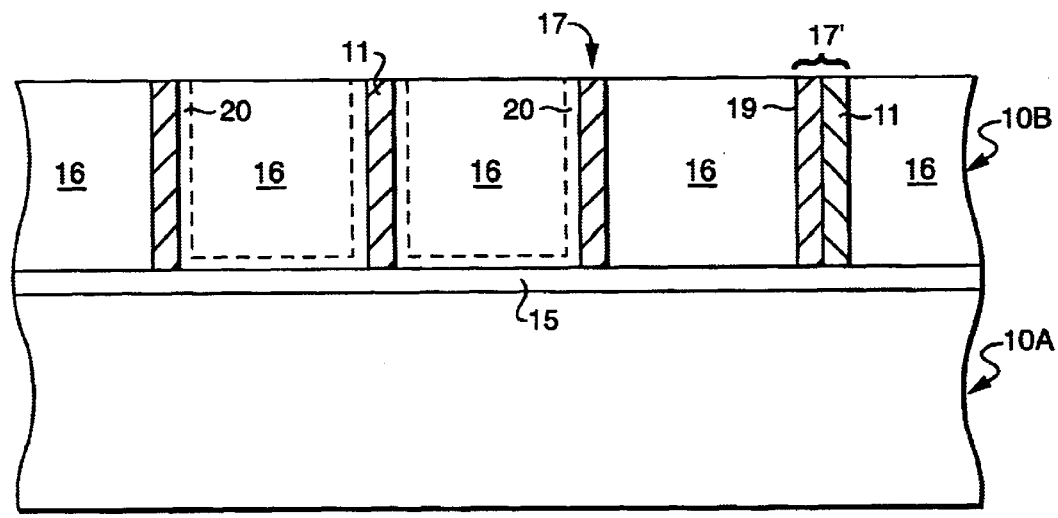
FIG. 1E is a simplified view of the construction of a bonded and vertically trenched silicon substrate, as known in the art.

As shown in FIG. 1E, bonded and trenched silicon wafer substrates overcome the space efficiency problems of traditional DI substrates. A pair of silicon wafers 10A, 10B is bonded together on opposite sides of a silicon dioxide insulating interface layer 15. Anisotropic etching is employed to provide active regions of silicon 16 with substantially straight sidewalls 19. The active regions are separated by substantially vertical trenches 17 and therefore can be more closely spaced than on a traditional DI substrate.

The substantially vertical trenches between adjacent silicon active regions may be filled with a dielectric insulator 11, such as tetraethyl orthosilicate (TEOS) and/or polycrystalline silicon. These materials are especially desirable for use with silicon wafers because of their thermal coefficients of expansion are close to that of silicon, thereby reducing the possibility that the dielectric insulator between the active regions will crack from thermal stress. The substrate may further be annealed prior to fabrication of the integrated circuits thereon. Alternatively or in addition, multiple trenches 17' may be formed to provide extra dielectric isolation between the active regions. The width of the trenches 17 or 17', and therefore the thickness of the insulating material within the trenches and between adjacent active regions of silicon, is preferably selected to withstand the operating voltage of the highest rated voltage device on the substrate without breakdown during operation, so that none of the circuits on the substrate is susceptible to voltage breakdown and current leakage during operation.

The silicon wafer 10B in the bonded and trenched substrate is processed so as to have either an excess of electrons (n-type conductivity) or an excess of electron vacancies, or holes (p-type conductivity). The silicon is then doped in selected regions with various n- or p-type dopants which increase or decrease the numbers of electrons or holes, as desired. P-type silicon is typically formed by doping the silicon with, for example, a boron-containing dopant so as to provide an excess of holes, whereas n-type silicon is typically formed by doping the silicon with a phosphorus- or arsenic-containing dopant so as to provide an excess of electrons. A p+ or n+ designation indicates a region in the silicon of relatively high concentration of the respective conductivity type, whereas a p− or n− designation indicates a region in the silicon of relatively low concentration of the respective conductivity type. Although the FIGURES illustrate the silicon as n-type conductivity, they may be of either the n or p type, and the invention is considered to cover the use of silicon of either conductivity type.

Figure 2:
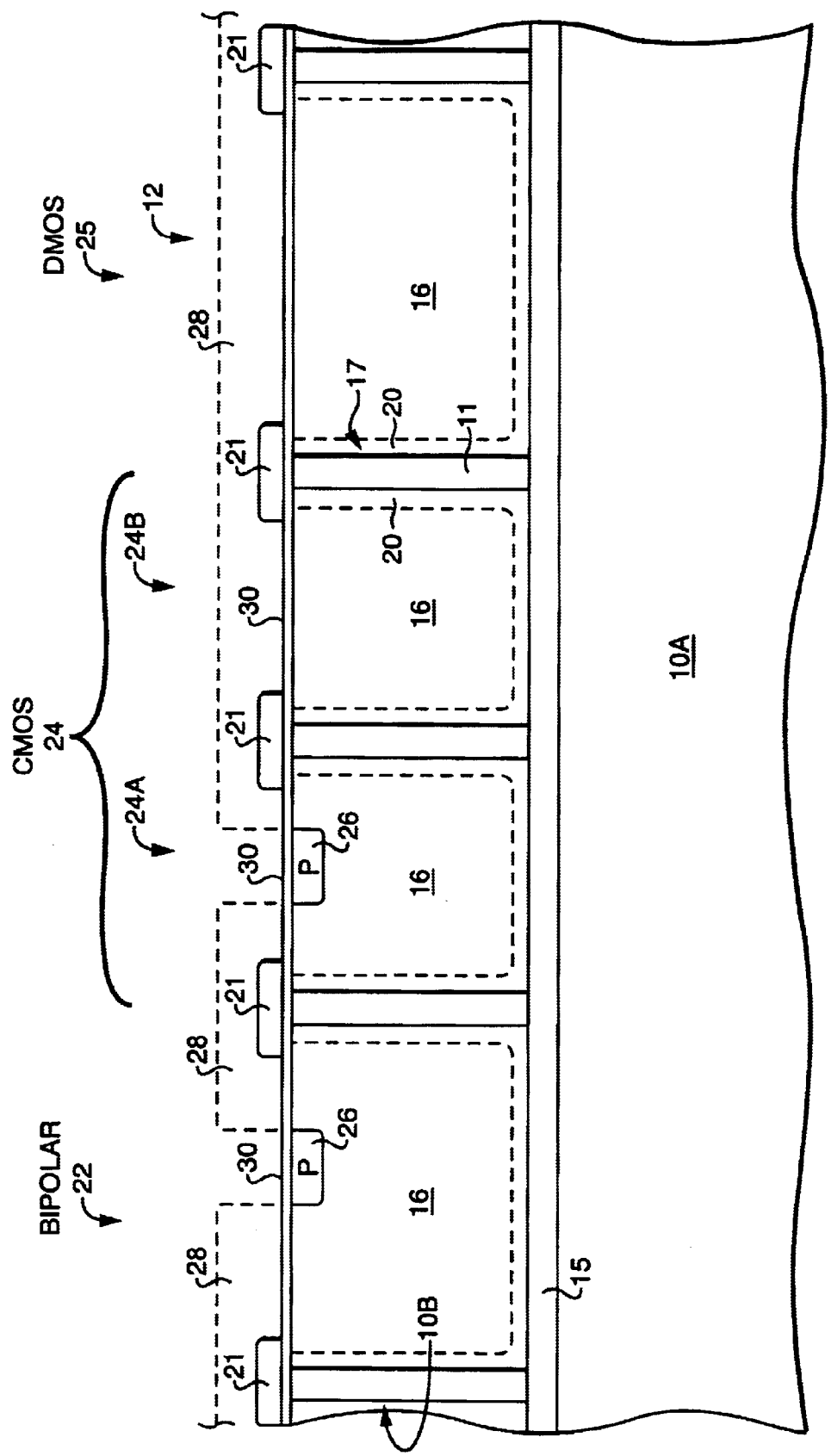
FIG. 2 is a simplified view of one embodiment of a high voltage integrated switching device, including intermediate, low and high voltage circuits employing, respectively, bipolar, CMOS and DMOS technologies, in which p-type regions are formed within the DMOS circuit and the n-channel of the CMOS circuit, all in accordance with the present invention.

As shown in FIG. 2, in accordance with the present invention, the junction-receiving wafer 10B, which may be either n-type or p-type silicon, is masked and anisotropically etched in a predetermined pattern to form a plurality of substantially rectangular active regions 16 having substantially vertical sidewalls 19 and separated by substantially vertical trenches 17 filled with a dielectric material 11. Each active region 16 is preferably sufficiently deep enough to withstand the voltage of the device to be fabricated therein without breakdown of the device or of the surrounding dielectric insulating material 11. The depth of the active region 16 determines the breakdown voltage of the associated device.

Each active region 16 includes a thin layer 20 of a relatively high concentration of the same conductivity type. The silicon of the junction-receiving wafer in the FIGURES is of the n-type, and therefore the so-called wraparound layer 20 is a high-concentration (n+) region of n-type silicon. If a p-type silicon is used, the wraparound layer 20 is a high-concentration (p+) region of p-type silicon.

A thin oxide layer 21 (shown only over the trenches in the accompanying FIGURES, and exaggerated in size for clarity) is then grown on the exposed active silicon regions to passivate the exposed silicon.

A high-voltage integrated switching device can be fabricated with multiple high voltage switching circuits on a single bonded and vertically trenched substrate. Such high voltage circuits can be relatively closely spaced, thus considerably reducing the real estate required for such a device. One or more intermediate and/or low voltage circuits, as well as other circuit components, may also be fabricated on the same substrate.

Figure 5:
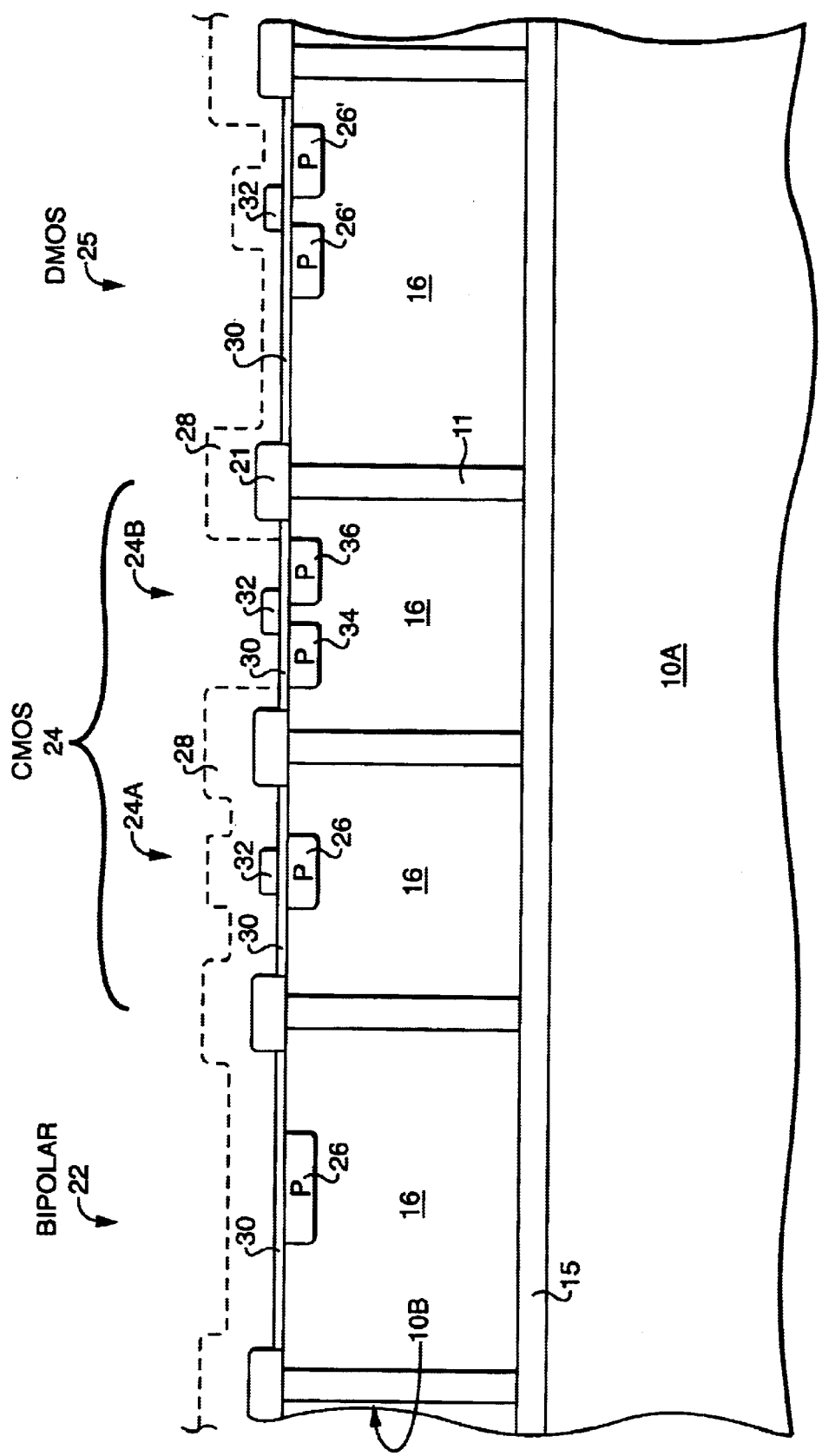
FIG. 5 is a simplified view of one embodiment of the bipolar, CMOS and DMOS circuits of FIG. 4, in which the source and drain for the p-channel of the CMOS circuit are grown.
Figure 6:
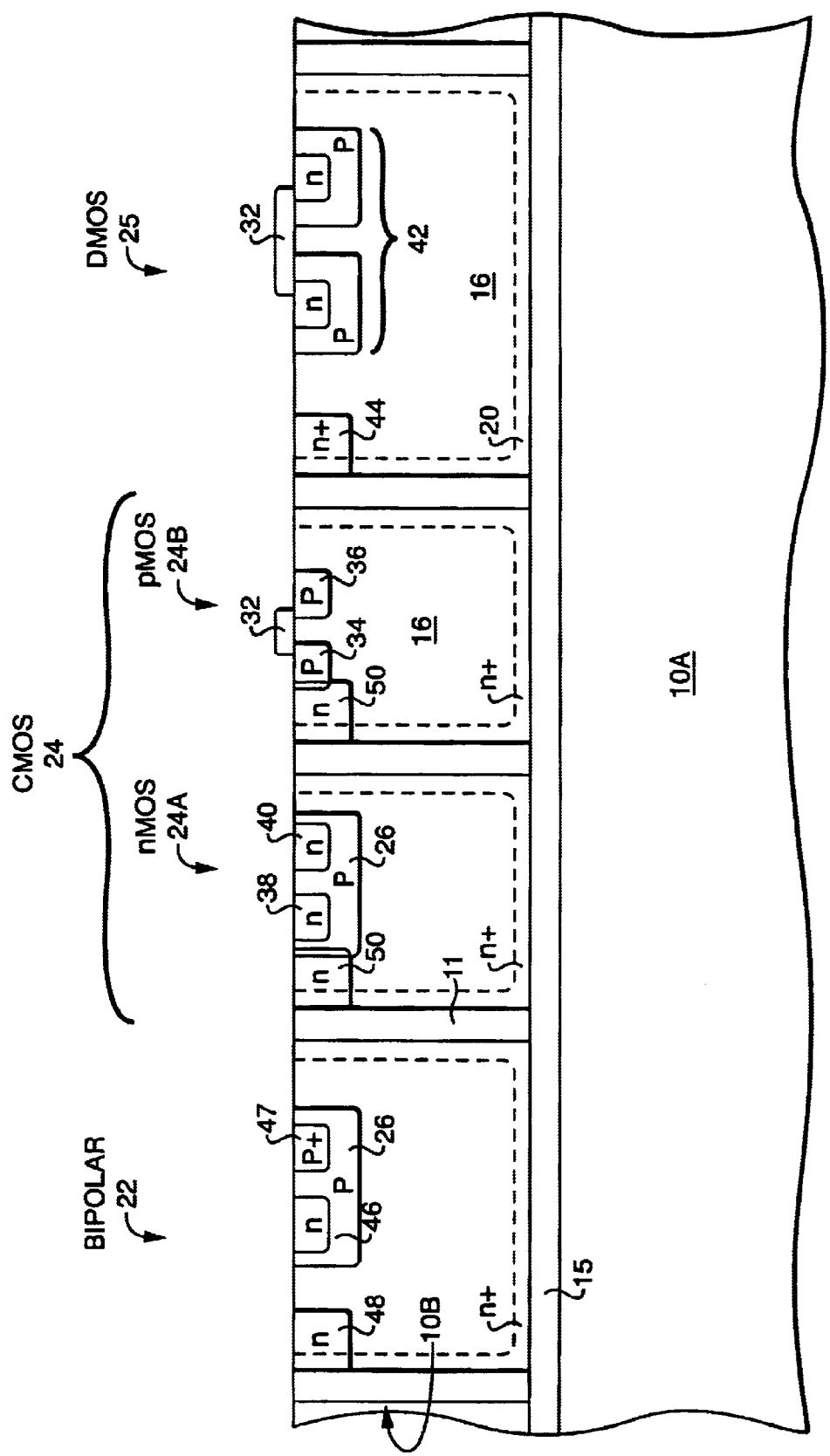
FIG. 6 is a simplified view of one embodiment of the bipolar, CMOS and DMOS circuits of FIG. 5, in which the source and drain of the n-channel of the CMOS and DMOS circuits, and the collector and emitter of the bipolar circuits, are grown.
Figure 7:
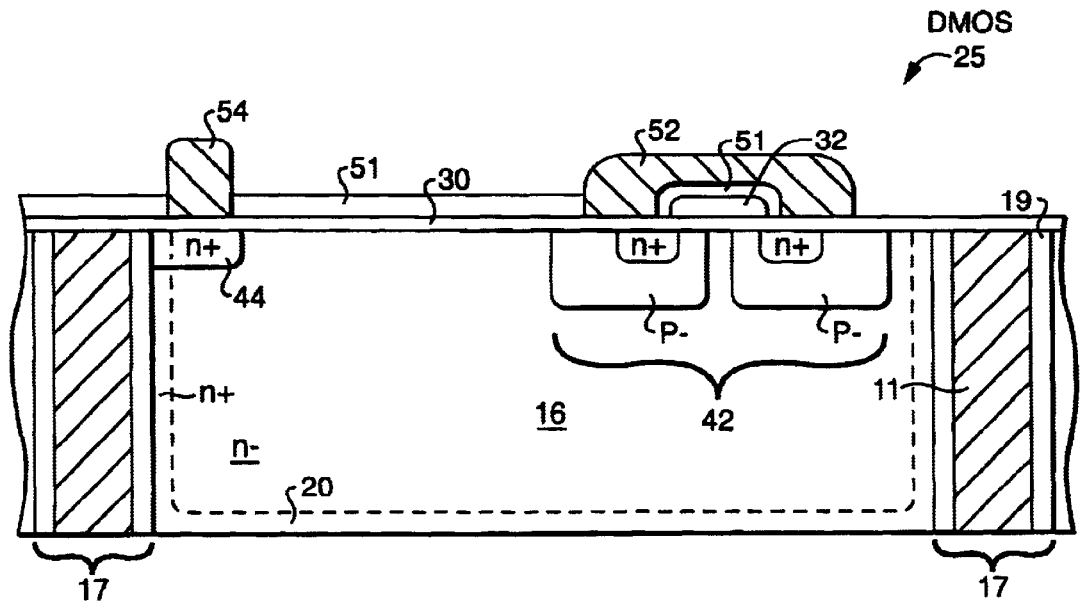
FIG. 7 is a simplified sectional view of one embodiment of a completed high voltage circuit employing DMOS technology in accordance with the present invention.
Figure 8:
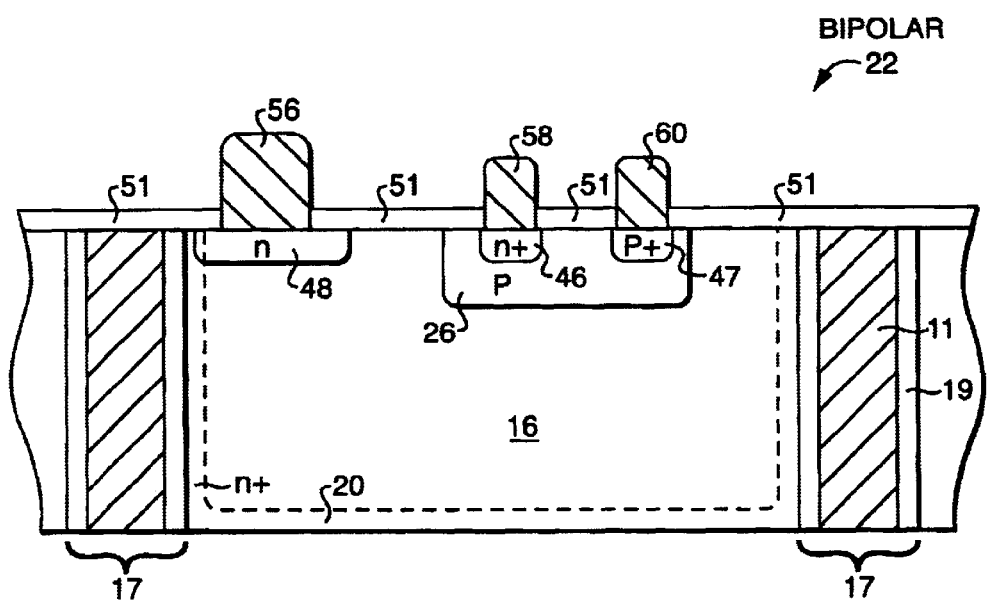
FIG. 8 is a simplified sectional view of one embodiment of a completed intermediate voltage circuit employing bipolar technology.
Figure 9:
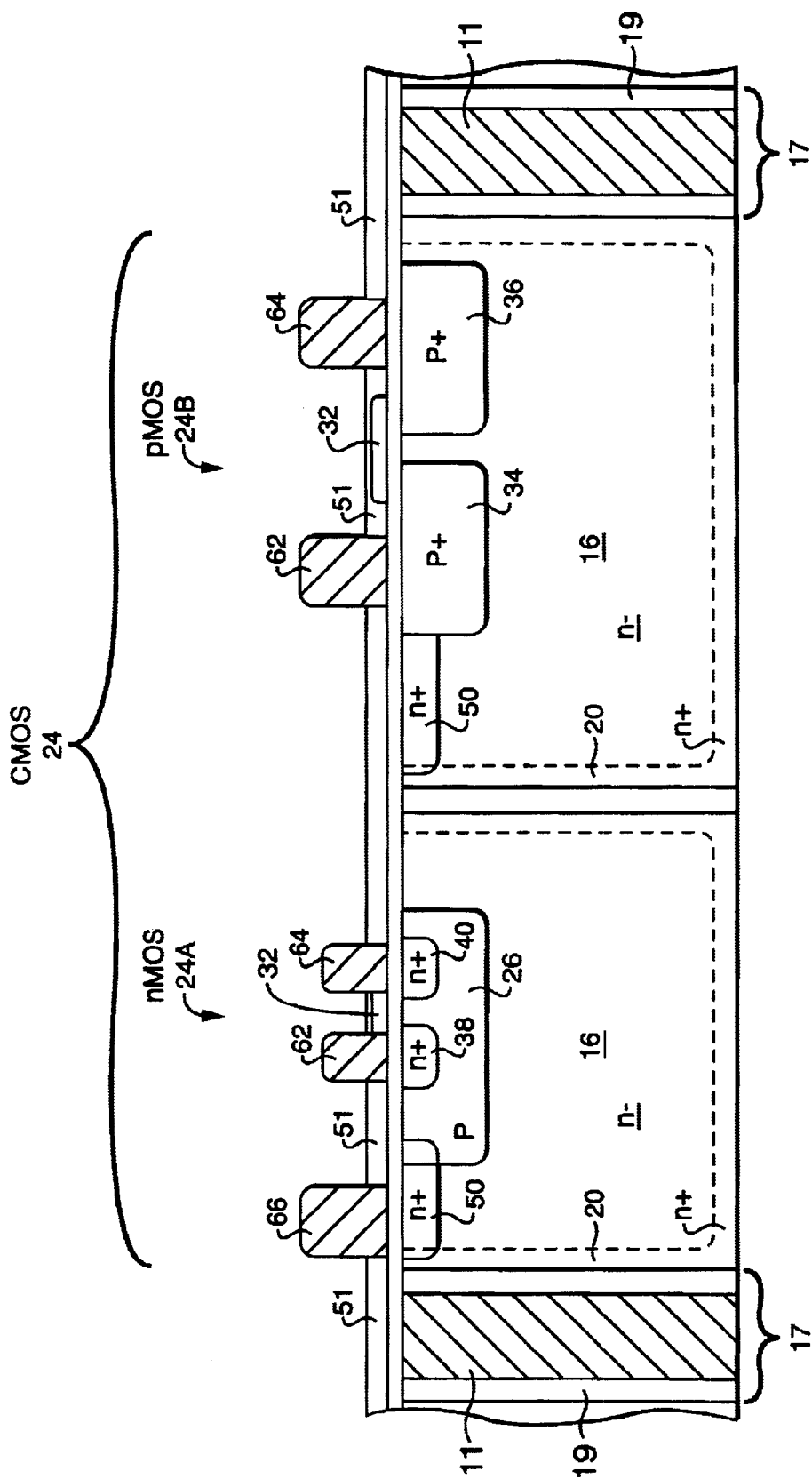
FIG. 9 is a simplified sectional view of one embodiment of a completed low voltage circuit employing CMOS technology.

For convenience of illustration and explanation, FIGS. 2–6 illustrate the fabrication of intermediate, low and high voltage circuits employing, respectively, bipolar, CMOS, and DMOS technologies, on a single bonded and vertically trenched, dielectrically isolated silicon substrate. FIG. 7 illustrates in detail a completed DMOS circuit. FIG. 8 illustrates in detail a completed CMOS circuit. FIG. 9 illustrates in detail a completed bipolar circuit.

As shown in FIGS. 2–6, in accordance with one aspect of the invention, a bipolar circuit 22, a CMOS circuit 24 including an n-channel portion 24A and a p-channel portion 24B, and a DMOS circuit 25, can all be formed in a single fabrication process. As shown in FIG. 2, the n-type silicon in the bipolar circuit 22 and the n-channel 24A of the CMOS circuit 24 are selectively masked with a photoresistive material 28, etched with a suitable etchant, and then doped with a p-type dopant to form p-type regions or wells 26 within the n-type active regions of the bipolar and CMOS circuits. In FIG. 2, the photoresistive material 28 is shown as a dotted line to illustrate that it is only temporarily present at any given stage of fabrication. The photoresistive material is selectively applied and removed to a substrate several times during a fabrication process as the circuit components are formed according to a predetermined design.

The regions of the bipolar circuit 22 and the n-channel 24A of the CMOS circuit 24 which are to be doped with a p-type dopant are then exposed to a uniform, relatively low concentration of a boron-containing dopant, typically by exposing the unmasked portions of the silicon active region to a boron-containing gas. This doping step is preferably performed in a suitable atmosphere at an elevated temperature which is sufficient to provide a desired depth and level of conductivity in the silicon active region. The photoresistive material is then removed from the masked portions of the silicon by application of a suitable etchant thereto.

Figure 3:
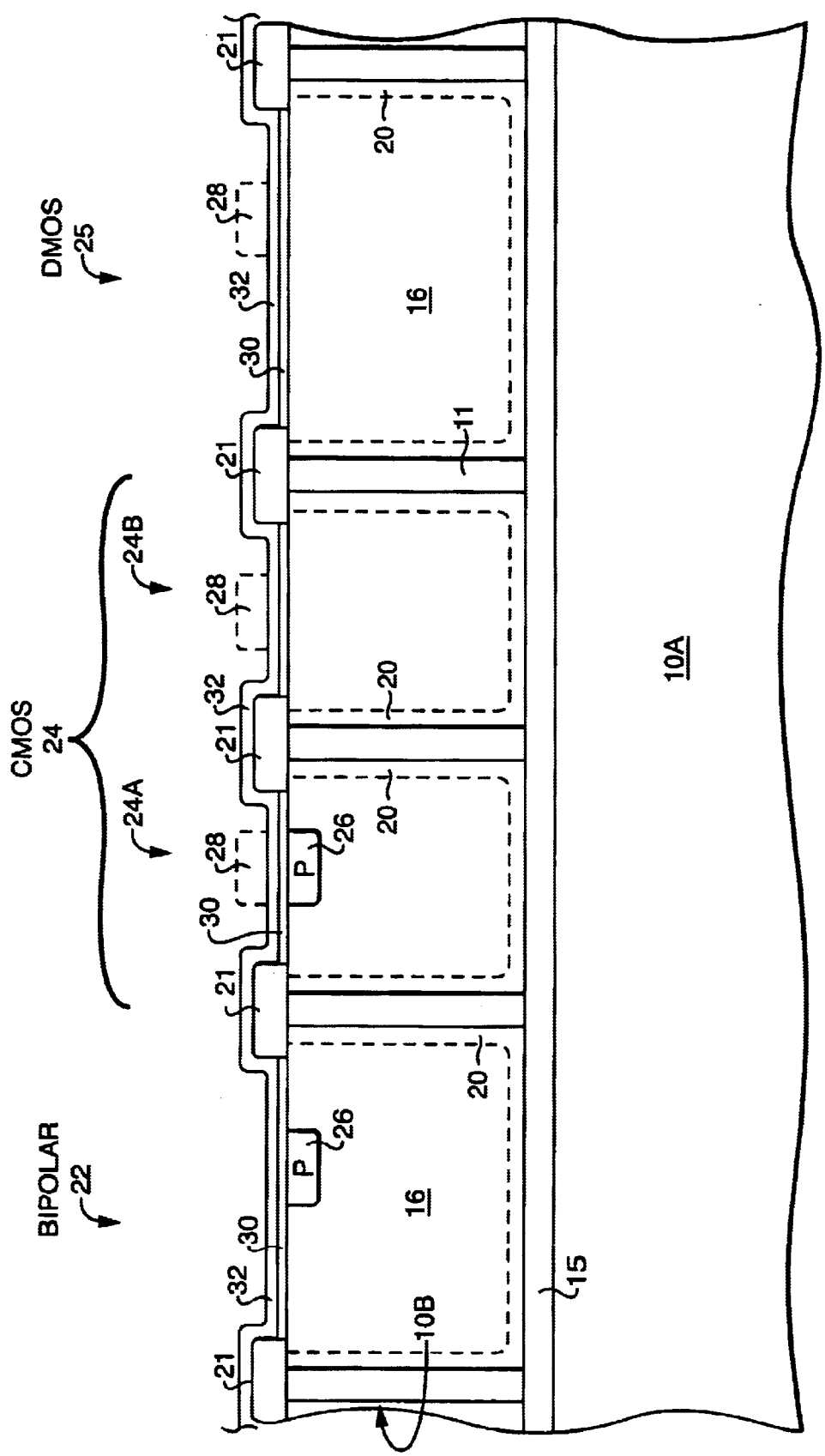
FIG. 3 is a simplified view of one embodiment of the bipolar, CMOS and DMOS circuits of FIG. 2, in which an insulating silicon dioxide layer and polycrystalline silicon layer are formed.
Figure 4:
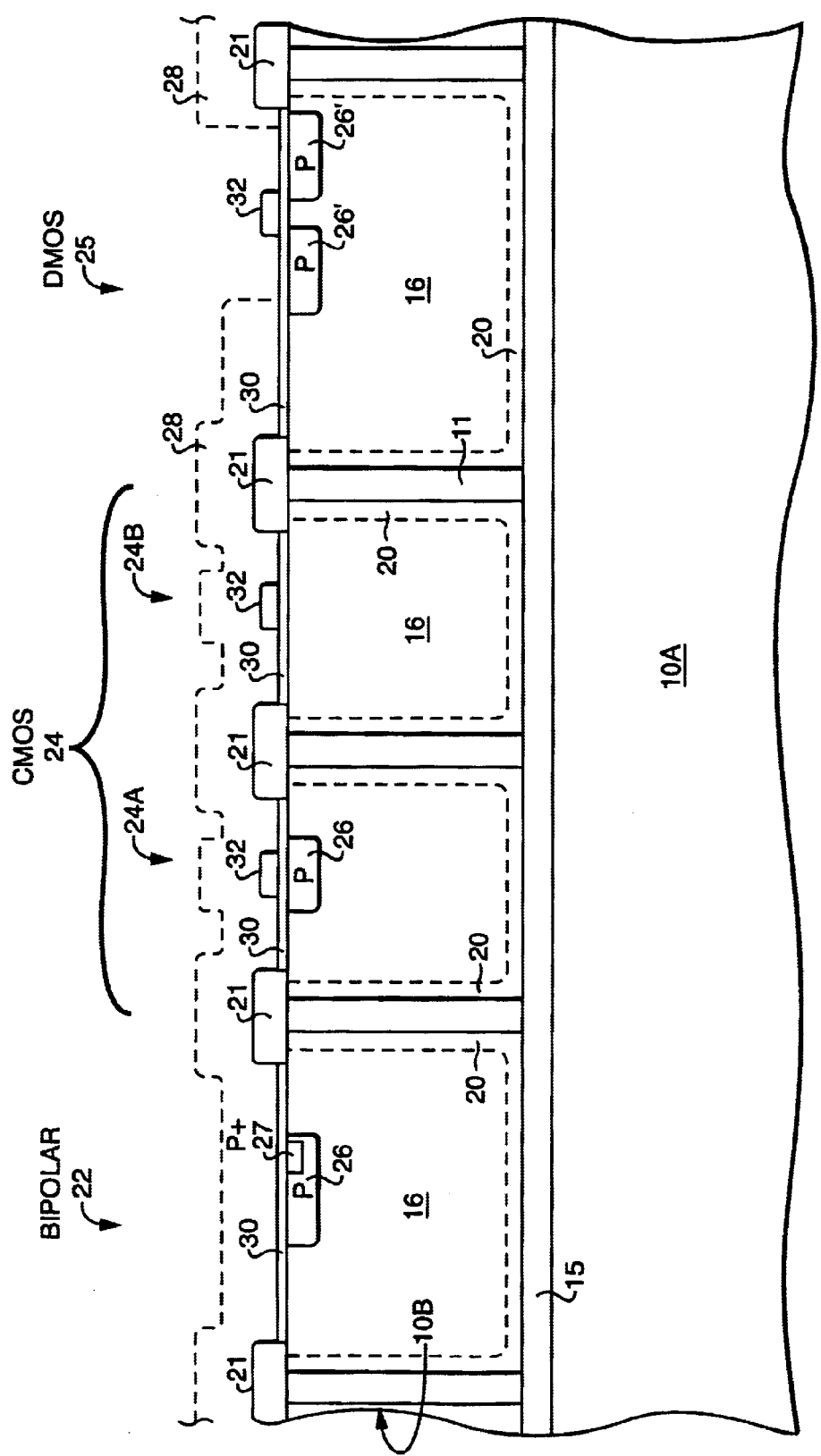
FIG. 4 is a simplified view of one embodiment of the bipolar, CMOS and DMOS circuits of FIG. 3, in which p-type regions are grown within the DMOS circuit, and a base for the bipolar circuit is grown.

As illustrated in FIG. 3, after the p-type regions 26 have been formed in the bipolar and n-channel circuits, a highly pure silicon dioxide layer 30 is grown over all exposed surfaces. A layer of polycrystalline silicon 32 is then grown over the silicon dioxide layer 30. Photoresistive material 28 is applied to selected portions of the circuits to mask those regions in which the polycrystalline silicon is to remain after an etching process is performed. In the illustrated embodiment, the polycrystalline silicon 32 is masked in the n-channel 24A and p-channel 24B of the CMOS circuit, as well as in the DMOS circuit 25. The polycrystalline silicon in the bipolar portion of the switch is not masked, and therefore during the etching step, substantially all of the polycrystalline silicon in the bipolar region will be removed. The oxide layer 30 beneath the polycrystalline silicon layer 32 protects the underlying active silicon from damage from the etchant. The polycrystalline layer 32 over the DMOS and CMOS circuits acts as a mask for a subsequent doping of those regions and self-aligns the base of the DMOS circuit and the source and drain of the CMOS circuit, as illustrated in FIGS. 4 and 6 and detailed more fully below. The photoresistive material 28 is then removed by application of a suitable etchant.

As shown in FIG. 4, two p-type regions 26' are then formed in the DMOS circuit 25, and a p+ region 27 is formed within the p-type region 26 of the bipolar circuit. As previously described, a photoresistive material 28 is applied to the active silicon regions of the DMOS circuit, and to a portion of the p-type region 26 of the bipolar circuit, which are not to be doped. A polycrystalline silicon island 32 in the DMOS region acts as a mask for an area between the p-type wells formed therein. A relatively high concentration of a p-type dopant, preferably a boron-containing gas, is used, and the doping is performed in a suitable atmosphere at a suitable temperature as previously discussed for a sufficient time to achieve a desired depth and level, or concentration, of p-type conductivity in the silicon active region of the DMOS circuit and in the p-type region of the bipolar circuit.

As shown in FIG. 5, source and drain contacts 34, 36 for the p-channel 24B of the CMOS circuit 24 are formed in a separate implant step. The silicon active region of the p-channel of the CMOS circuit are doped with a p-type dopant, such as a boron-containing gas, under the conditions previously described to achieve a desired p-type depth and concentration in the silicon active region.

As shown in FIG. 6, n-type regions defining source and drain contacts 38, 40 for the n-channel of the CMOS circuit, and source and drain contacts 42, 44 for the DMOS circuit 25, are formed. In this step also, n-type regions defining the emitter 46 and collector 48 for the bipolar circuit 22 are formed. The n-type source and drain contacts 38, 40 and the emitter 46 are formed in the respective p-type regions 26 formed in a previous fabrication step (discussed in connection with FIG. 2). An n-type bootstrap region 50 is also formed in the n- and p-channels 24A, 24B of the CMOS circuit, for connecting the p-type regions to the n+ wraparound regions 20 and for maintaining a desired minimum potential on the p-type regions.

Although not shown in the FIGS., in accordance with another aspect of the present invention, other components which are necessary to complete the DMOS, bipolar and/or CMOS circuits, including resistors, diodes and capacitors, can be formed during the fabrication of these principle circuits. For example, the base and source of the DMOS circuit also function as a diode. The silicon dioxide and polycrystalline silicon layers function as resistors, and the p-type well regions function as capacitors. Thus, all the necessary components that are required for proper operation of the DMOS, bipolar and/or CMOS circuits are fabricated in a single process.

As shown in FIGS. 7–9, a suitable insulating material, such as tetraethyl orthosilicate (TEOS) or phosphorus-doped silicon glass (PSG), is deposited over all exposed surfaces to form a relatively thick insulating "field" oxide layer 51 which passivates the circuits prior to the formation of electrically conductive contact pads.

FIG. 7 illustrates in detail one embodiment of the completed DMOS circuit 25. Electrically conductive source contact pad 52 and drain contact pad 54 are deposited over the respective source and drain contacts 42, 44 of the circuit. As set forth above, the depth of the active region 16 determines the breakdown voltage of the associated device. As shown in FIG. 7, the drain region 44 of DMOS device 25 is electrically connected to the insulating layer 15 by wraparound layer 20. In operation, when the device 25 is conducting, current flows from the source 42 vertically downward to the wraparound region 20, travels along the wraparound region 20 and then vertically upward to the drain 44. This type of device is referred to as a "vertical" DMOS device. In such a vertical device, the breakdown voltage of the device is adjusted by varying the depth of the active region 16. In other words, in order to increase the breakdown voltage of the device, the depth of the active region 16 is increased. This enables the device to have an increased breakdown voltage without increasing the surface area of the device, which results in an increased number of devices that can be fit onto a chip.

FIG. 8 illustrates one embodiment of the completed bipolar circuit 22. Electrically conductive contact pads 56, 58, 60 are deposited over, respectively, the collector 48, the emitter 46, and the base 47 of the circuit.

FIG. 9 illustrates one embodiment of the completed CMOS circuit 24, including n-channel 24A and p-channel 24B. Electrically conductive contact pads 62, 64 are deposited over the p-type source and drain contacts 34, 36 of the p-channel 24B and over the n-type source and drain contacts 38, 40 of the n-channel 24A. An electrically conductive contact 66 to ground is formed over bootstrap region 50 in the n-channel 24A.

Each silicon substrate preferably includes multiple high-voltage integrated circuits in relatively close proximity to one another. In one preferred embodiment, the high-voltage circuits are bidirectional switching circuits that employ DMOS technology and have a breakdown voltage of at least 100 volts, and more typically at least 350 volts or higher.

The substrate may additionally include one or more low- or intermediate-voltage integrated circuits. For example, a line card access switching device used in telephone switching applications may include multiple high-, intermediate- and low voltage integrated circuits on a single substrate using bipolar complementary double diffused metal oxide semiconductor (BCDMOS) technologies. The bipolar circuits may be transistors or switching circuits and typically have a breakdown voltage of up to about 100 volts. The CMOS circuits are typically logic circuits and have a breakdown voltage of up to about 20 volts. All three types of circuits are closely spaced on a single silicon substrate without exhibiting current leakage or inter-circuit breakdown during normal circuit operation.

A high-voltage integrated switching device can be made by suitably masking and etching a bonded wafer silicon substrate to form substantially vertical trenches separating active regions on which individual high voltage circuits will be fabricated. The trenches are preferably of a width sufficient to withstand the operating voltages of the highest rated device or devices on the substrate without breakdown of the dielectric insulating material between adjacent devices. The silicon active regions are then passivated by forming an insulating layer of silicon dioxide over them.

Suitable masking and doping is done to define a p-type region within the n-channel of a CMOS circuit, if present, and a p-type region within a bipolar circuit, if present. A highly pure silicon dioxide layer is grown over all exposed surfaces, and a polycrystalline silicon layer is grown over the silicon dioxide layer. Suitable masking and doping is done to define two p-type regions in the DMOS circuit. Source and drain contacts are then formed in the p-channel of the CMOS circuit and the base contact of the bipolar circuit. Source and drain contacts for the DMOS circuit and the n-channel of the CMOS circuit are then formed, as well as the emitter and collector contacts of the bipolar circuit. A field oxide insulating layer is formed over all circuits, and electrically conductive contacts are formed over the source and drain contacts of the DMOS and CMOS circuits and over the collector, base and emitter contacts of the bipolar circuit. The entire circuit is then passivated with a suitable insulating material, such as, for example, silicon nitride.

The devices and methods of the present invention allow multiple high voltage circuits to be fabricated on a single bonded and trenched dielectrically isolated silicon substrate without dielectric breakdown of the substrate. Thus, significant reductions in device size and fabrication costs are realized.

Because certain changes may be made in the above apparatus without departing from the scope of the invention herein disclosed, it is intended that all matter contained in the above description or shown in the accompanying drawings shall be interpreted in an illustrative and not a limiting sense.

What is claimed is:

1. A high voltage integrated switching device comprising:
   a dielectrically isolated, bonded and vertically trenched silicon substrate;
   at least one high voltage switching circuit fabricated on the substrate, and including an active region having a single conductivity-type layer having a depth;
   at least one intermediate voltage circuit fabricated on the substrate; and
   at least one low voltage circuit fabricated on the substrate;
   wherein the high voltage switching circuit is characterized by a breakdown voltage of at least 100 volts, the intermediate voltage circuit is characterized by a breakdown voltage of up to approximately 100 volts, and the low voltage circuit is characterized by a breakdown voltage of up to approximately 20 volts;
   wherein the breakdown voltage of said high voltage switching circuit is relative to said depth of said layer of said active region of said high voltage switching circuit, such that an increase in said depth of said layer of said active region results in an increase in said breakdown voltage of said high voltage switching circuit;
   wherein said high voltage switching circuit is constructed such that, in operation, current flows through said active region substantially perpendicular to a top surface of said silicon substrate;
   wherein said high voltage switching circuit includes a conductive wraparound layer which substantially encompasses all but an upper surface of said active region; and
   wherein said current flows from a source of said high voltage switching circuit through said active region to said wraparound layer to a drain of said high voltage switching circuit.

2. A high voltage integrated switching device according to claim 1, wherein said high voltage switching circuit, said intermediate voltage circuit and said low voltage circuit comprise a line card access switching device.

3. A high voltage integrated switching device comprising:
   a dielectrically isolated, bonded and vertically trenched silicon substrate; and
   a line card access switching device formed in said silicon substrate, said line card access switching device comprising:
      at least one high voltage switching circuit fabricated on the substrate, and including an active region having a single conductivity-type layer having a depth;
      at least one intermediate voltage circuit fabricated on the substrate; and
      at least one low voltage circuit fabricated on the substrate;
      wherein the high voltage switching circuit is characterized by a breakdown voltage of at least 100 volts, the intermediate voltage circuit is characterized by a breakdown voltage of up to approximately 100 volts, and the low voltage circuit is characterized by a breakdown voltage of up to approximately 20 volts; and
      wherein the breakdown voltage of said high voltage switching circuit is relative to said depth of said layer of said active region of said high voltage switching circuit, such that an increase in said depth of said layer of said active region results in an increase in said breakdown voltage of said high voltage switching circuit;

wherein said high voltage switching circuit is constructed such that, in operation, current flows through said active region substantially perpendicular to a top surface of said silicon substrate.

4. A high voltage integrated switching device according to claim 3, wherein said high voltage switching circuit includes a conductive wraparound layer which substantially encompasses all but an upper surface of said active region, wherein said current flows from a source of said high voltage switching circuit through said active region to said wraparound layer to a drain of said high voltage switching circuit.

5. A high voltage integrated switching device comprising:

a dielectrically isolated, bonded and vertically trenched silicon substrate;

at least one high voltage switching circuit fabricated on the substrate, and including an active region having a depth:

at least one intermediate voltage circuit fabricated on the substrate: and at least one low voltage circuit fabricated on the substrate;

wherein the breakdown voltage of said high voltage switching circuit is relative to said depth of said active region of said high voltage switching circuit, such that an increase in said depth of said active region results in an increase in said breakdown voltage of said high voltage switching circuit;

wherein said high voltage switching circuit is constructed such that, in operation, current flows through said active region substantially perpendicular to a top surface of said silicon substrate;

wherein said high voltage switching circuit includes a conductive wraparound layer which substantially encompasses all but an upper surface of said active region; and wherein said current flows from a source of said high voltage switching circuit through said active region to said wraparound layer to a drain of said high voltage switching circuit.

* * * * *